United States Patent
Kim et al.

(10) Patent No.: US 11,225,721 B2
(45) Date of Patent: Jan. 18, 2022

(54) THIN FILM ETCHANT COMPOSITION AND METHOD OF FORMING METAL PATTERN BY USING THE SAME

(71) Applicants: SAMSUNG DISPLAY CO., LTD., Yongin-si (KR); DONGWOO FINE-CHEM Co., Ltd., Jeollabuk-do (KR)

(72) Inventors: Jinhyung Kim, Yongin-si (KR); Joohwan Chung, Yongin-si (KR); Jinsook Kim, Yongin-si (KR); Haccheol Kim, Yongin-si (KR); Byungsu Lee, Yongin-si (KR); Changsoo Kim, Yongin-si (KR); Jungseek Jung, Yongin-si (KR); Dongki Kim, Jeollabuk-do (KR); Sangtae Kim, Jeollabuk-do (KR); Giyong Nam, Yongin-si (KR); Youngchul Park, Jeollabuk-do (KR); Kyungbo Shim, Jeollabuk-do (KR); Daesung Lim, Jeollabuk-do (KR); Sanghoon Jang, Jeollabuk-do (KR)

(73) Assignees: SAMSUNG DISPLAY CO., LTD., Yongin-si (KR); DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/284,629

(22) Filed: Feb. 25, 2019

(65) Prior Publication Data
US 2019/0368053 A1    Dec. 5, 2019

(30) Foreign Application Priority Data

May 30, 2018 (KR) ......................... 10-2018-0062134

(51) Int. Cl.
*C23F 1/30* (2006.01)
*H01L 21/3213* (2006.01)
(Continued)

(52) U.S. Cl.
CPC ................ *C23F 1/30* (2013.01); *C09K 13/00* (2013.01); *C09K 13/04* (2013.01); *C09K 13/06* (2013.01);
(Continued)

(58) Field of Classification Search
None
See application file for complete search history.

(56) References Cited

U.S. PATENT DOCUMENTS

2014/0038348 A1*  2/2014  Kim ................... H01L 29/66969
                                                                438/99
2018/0371625 A1* 12/2018  Park ..................... H01L 27/1244

FOREIGN PATENT DOCUMENTS

| KR | 10-2008-0009866 | 1/2008 |
| KR | 10-2008-0110259 | 12/2008 |

(Continued)

*Primary Examiner* — Jiong-Ping Lu
(74) *Attorney, Agent, or Firm* — F. Chau & Associates, LLC

(57) ABSTRACT

A thin film etchant composition for preventing re-adsorption of an etched metal and uniformly etching a thin film is provided. The thin film etchant composition includes about 43 wt % to about 46 wt % of phosphoric acid, about 5 wt % to about 8 wt % of nitric acid, about 10 wt % to about 17 wt % of acetic acid, about 1 wt % to about 3 wt % of iron nitrate, about 0.7 wt % to about 1.5 wt % of phosphate, and deionized water as a remaining amount based on a total weight of the thin film etchant composition.

19 Claims, 8 Drawing Sheets

(51) Int. Cl.
    *C09K 13/04*            (2006.01)
    *C09K 13/00*            (2006.01)
    *H01L 21/465*          (2006.01)
    *C09K 13/06*            (2006.01)
    *H01L 21/302*          (2006.01)
    *H01L 21/306*          (2006.01)
    *H01L 29/786*          (2006.01)
    *C23F 1/16*             (2006.01)

(52) U.S. Cl.
    CPC .............. *C23F 1/16* (2013.01); *H01L 21/302* (2013.01); *H01L 21/306* (2013.01); *H01L 21/3213* (2013.01); *H01L 21/32134* (2013.01); *H01L 21/465* (2013.01); *H01L 29/7869* (2013.01)

(56) References Cited

FOREIGN PATENT DOCUMENTS

| | | | | |
|---|---|---|---|---|
| KR | 10-2009-0081546 | | 7/2009 | |
| KR | 10-2016-0108944 | | 9/2016 | |
| KR | 20160108944 | * | 9/2016 | ............. C09K 13/04 |
| KR | 10-2016-0115189 | | 10/2016 | |
| KR | 10-1738371 | | 5/2017 | |

* cited by examiner

FIG. 7a
FIG. 7b
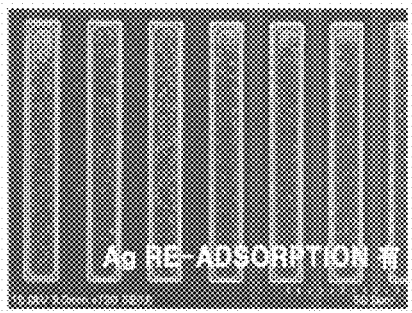 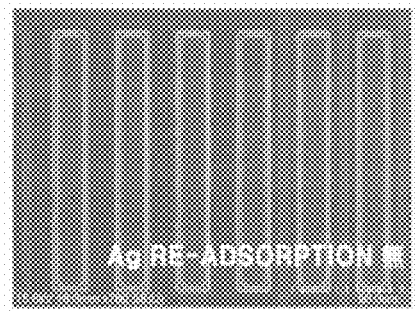
FIG. 8a
FIG. 8b
 

THIN FILM ETCHANT COMPOSITION AND METHOD OF FORMING METAL PATTERN BY USING THE SAME

CROSS-REFERENCE TO RELATED APPLICATION

This application claims the benefit under 35 U.S.C § 19 of Korean Patent Application No. 10-2018-0062134, filed on May 30, 2018, in the Korean Intellectual Property Office, the disclosure of which is incorporated by reference herein in its entirety.

TECHNICAL FIELD

Exemplary embodiments of the present disclosure relate to a thin film etchant composition and a method of forming a metal pattern by using the same, and more particularly, to a thin film etchant composition for preventing re-adsorption of an etched metal and uniformly etching a thin film.

DISCUSSION OF RELATED ART

With the arrival of the information age, various flat panel display devices for processing and displaying a large amount of information have been rapidly developed recently. Examples of the flat panel display devices include a liquid crystal display (LCD) device, a plasma display panel (PDP) device, a field emission display (FED) device, and an organic light-emitting diode (OLED).

Since the OLED may be driven at a low voltage while emitting light itself, it has been rapidly applied to small portable display apparatuses, and is on the verge of being commercialized on large televisions. As the sizes of display screens increase, the lengths of wiring lines increase, and as a result, the wiring resistance increases. The increase in the wiring resistance may cause signal delay. Accordingly, lowering the wiring resistance with a material having low resistivity is required in manufacturing these large display devices.

Since silver (Ag) has a low resistivity, a high luminance, and a high conductivity as compared with other metals, efforts have been made to realize flat panel display devices having large sizes, high resolution, and low power consumption by applying a silver (Ag) layer (silver has a resistivity of about 1.59 Ω·cm), a silver alloy layer, or a multi-layer including the silver layer or the silver alloy layer to electrodes, wiring lines, and reflective layers of a color filter. In addition, a suitable etchant for patterning the silver (Ag) containing layer is required.

During the process of patterning the silver (Ag) containing layer, residue may occur due to poor etching, or the silver (Ag) containing layer may be excessively etched or unevenly etched to cause lifting or peeling of a wiring line, and the side profile of the wiring line may become poor. Therefore, it is required to develop a new etchant which may solve these problems.

SUMMARY

Exemplary embodiments of the present disclosure provide a thin film etchant composition for preventing re-adsorption of an etched metal and uniformly etching a thin film, and a method of forming a metal pattern using the same. However, the exemplary embodiments are merely examples, and the scope of the present disclosure is not limited thereto.

Additional aspects will be set forth in part in the description which follows and, in part, will be apparent from the description, or may be learned by practice of the presented exemplary embodiments.

According to an exemplary embodiment of the present disclosure, a thin film etchant composition includes: about 43 wt % to about 46 wt % of phosphoric acid; about 5 wt % to about 8 wt % of nitric acid; about 10 wt % to about 17 wt % of acetic acid; about 1 wt % to about 3 wt % of iron nitrate; about 0.7 wt % to about 1.5 wt % of phosphate; and deionized water as a remaining amount based on a total weight of the thin film etchant composition.

The thin film etchant composition may be capable of etching a single layer including silver (Ag) or silver alloy, or a multi-layer including the single layer and an indium-containing oxide layer.

The indium-containing oxide layer may include one or more selected from indium tin oxide (ITO), indium zinc oxide (IZO), indium tin zinc oxide (ITZO), and indium gallium zinc oxide (IGZO).

The silver alloy may include silver (Ag) and one or more selected from neodymium (Nd), copper (Cu), palladium (Pd), niobium (Nb), nickel (Ni), molybdenum (Mo), chromium (Cr), magnesium (Mg), tungsten (W), protactinium (Pa), and titanium (Ti).

The iron nitrate may include at least one selected from ferrous nitrate and ferric nitrate.

The phosphate may include one or more selected from monosodium phosphate ($NaH_2PO_4$), disodium phosphate ($Na_2HPO_4$), trisodium phosphate ($Na_3PO_4$), monopotassium phosphate ($KH_2PO_4$), dipotassium phosphate ($K_2HPO_4$), monoammonium phosphate (($NH_4)H_2PO_4$), diammonium phosphate (($NH_4)_2HPO_4$), and triammonium phosphate (($NH_4)_3PO_4$).

The thin film etchant composition may have a viscosity in a range of about 5.0 cP to about 5.5 cP at 40° C.

The thin film etchant composition may include 45 wt % of phosphoric acid, 6.5 wt % of nitric acid, 15 wt % of acetic acid, 2 wt % of iron nitrate, 1 wt % of phosphate, and deionized water as a remaining amount based on the total weight of the thin film etchant composition.

According to an exemplary embodiment of the present disclosure, a method of forming a conductive layer pattern includes: preparing a substrate on which a conductive layer including silver (Ag) is positioned; and etching the conductive layer to form the conductive layer pattern, in which the etching of the conductive layer includes etching the conductive layer with a thin film etchant composition including about 43 wt % to about 46 wt % of phosphoric acid, about 5 wt % to about 8 wt % of nitric acid, about 10 wt % to about 17 wt % of acetic acid, about 1 wt % to about 3 wt % of iron nitrate, about 0.7 wt % to about 1.5 wt % of phosphate, and deionized water as a remaining amount based on a total weight of the thin film etchant composition.

According to an exemplary embodiment of the present disclosure, a method of manufacturing an array substrate for a display device includes: forming a semiconductor layer on a substrate; forming a gate electrode over the semiconductor layer; forming a source electrode and a drain electrode over the gate electrode; forming a thin film electrically connected to the source electrode or the drain electrode, the thin film including silver (Ag); and etching the thin film to form a pixel electrode, in which the etching of the thin film includes etching the thin film with a thin film etchant composition including about 43 wt % to about 46 wt % of phosphoric acid, about 5 wt % to about 8 wt % of nitric acid, about 10 wt % to about 17 wt % of acetic acid, about 1 wt % to about 3 wt % of iron nitrate, about 0.7 wt % to about 1.5 wt % of phosphate, and deionized water as a remaining amount based on a total weight of the thin film etchant composition.

At least one of the gate electrode, the source electrode, and the drain electrode may include aluminum (Al).

The method may further include: forming a pad portion on one side of the substrate, in which a pad electrode of the pad portion may include aluminum (Al).

The forming of the pad portion may be performed simultaneously with the forming of the gate electrode or the forming of the source electrode and the drain electrode.

During the etching of the thin film, the pad electrode may be exposed to the thin film etchant composition.

According to an exemplary embodiment of the present disclosure, a thin film etchant composition to etch a thin film, the thin film includes silver (Ag) and the thin film etchant composition includes phosphoric acid, nitric acid, acetic acid, ferric nitrate ($Fe(NO_3)_3$), and monosodium phosphate ($NaH_2PO_4$).

The thin film etchant composition may include: about 43 wt % to about 46 wt % of the phosphoric acid; about 5 wt % to about 8 wt % of the nitric acid; about 10 wt % to about 17 wt % of the acetic acid; about 1 wt % to about 3 wt % of the ferric nitrate ($Fe(NO_3)_3$); about 0.7 wt % to about 1.5 wt % of the monosodium phosphate ($NaH_2PO_4$); and deionized water as a remaining amount based on a total weight of the thin film etchant composition.

The thin film etchant composition may have a viscosity in a range of about 5.0 cP to about 5.5 cP at 40° C.

The thin film etchant composition may be capable of etching a single layer including silver (Ag) or silver alloy, or a multi-layer including the single layer and an indium-containing oxide layer.

The indium-containing oxide layer may include one or more selected from indium tin oxide (ITO), indium zinc oxide (IZO), indium tin zinc oxide (ITZO), and indium gallium zinc oxide (IGZO).

The silver alloy may include silver (Ag) and one or more selected from neodymium (Nd), copper (Cu), palladium (Pd), niobium (Nb), nickel (Ni), molybdenum (Mo), chromium (Cr), magnesium (Mg), tungsten (W), protactinium (Pa), and titanium (Ti).

According to an exemplary embodiment of the present disclosure, a method of forming a silver-containing conductive layer pattern includes: preparing a substrate; forming an aluminum-containing conductive layer pattern on the substrate; forming a silver-containing conductive layer on the substrate and exposing the aluminum-containing conductive layer pattern; and etching the silver-containing conductive layer to form the silver-containing conductive layer pattern with a thin film etchant composition, in which the thin film etchant composition includes about 43 wt % to about 46 wt % of phosphoric acid, about 5 wt % to about 8 wt % of nitric acid, about 10 wt % to about 17 wt % of acetic acid, about 1 wt % to about 3 wt % of ferric nitrate ($Fe(NO_3)_3$), about 0.7 wt % to about 1.5 wt % of phosphate, and deionized water as a remaining amount based on a total weight of the thin film etchant composition.

During the etching of the silver-containing conductive layer, the aluminum-containing conductive layer pattern may be exposed to the thin film etchant composition.

These general and specific exemplary embodiments may be implemented by using a system, a method, or a combination of the system, the method, and a computer program.

BRIEF DESCRIPTION OF THE DRAWINGS

These and/or other aspects will become apparent and more readily appreciated from the following description of the exemplary embodiments, taken in conjunction with the accompanying drawings in which:

FIGS. 7a and 7b are scanning electron microscope (SEM) photographs taken to check whether a silver (Ag) residue occurs after an electrode layer is etched with an etchant; and FIGS. 8a and 8b are SEM photographs taken to check whether a tip defect occurs in an upper indium tin oxide (ITO) layer after an electrode layer is etched with an etchant.

Figure 1:
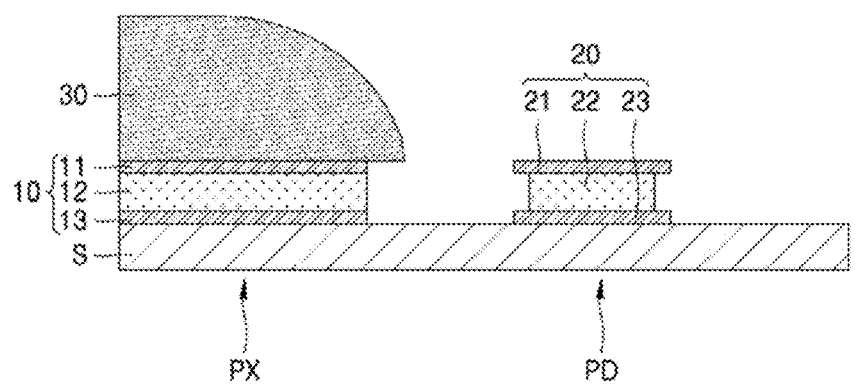
FIG. 1 is a cross-sectional view of a silver thin film etched by using a thin film etchant composition according to an exemplary embodiment of the present disclosure.

Since the drawings in FIGS. 1-6 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As the present disclosure allows for various changes and numerous embodiments, particular exemplary embodiments will be illustrated in the drawings and described in detail in the written description. Effects and characteristics of the present disclosure and methods of achieving these will be clearly explained in the detailed descriptions by referring to the accompanying drawings. However, the present disclosure is not limited to the specific exemplary embodiments described hereinafter, and may be implemented in many different forms.

Hereinafter, reference will now be made in detail to the exemplary embodiments of the present disclosure, examples of which are illustrated in the accompanying drawings. In the drawings, the same elements are denoted by the same reference numerals, and a repeated explanation thereof will not be given.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain exemplary embodiment is implemented differently, a specific process order may be performed differently from the described order. For example, two consecutively described processes may be performed substantially at the same time or performed in an order opposite to the described order.

FIG. 1 is a cross-sectional view of a silver thin film etched by using a thin film etchant composition according to an exemplary embodiment of the present disclosure. FIGS. 2a to 2f are conceptual views schematically illustrating a process of etching a silver thin film by using a thin film etchant composition according to an exemplary embodiment of the present disclosure.

Referring to FIG. 1, a pixel electrode 10 and a pad electrode 20 may be respectively patterned on a pixel portion PX and a pad portion PD on a substrate S. The substrate S may include one of various materials having durability and heat resistance. For example, the substrate S may include a metal material, a plastic material, a glass material, or the like. To form the pixel electrode 10 and the pad electrode 20 as described above, a conductive layer may be formed on the substrate S, and the conductive layer may be patterned by etching. The conductive layer may include a metal such as, for example, silver (Ag) or aluminum (Al). For example, before the patterning of a silver-containing conductive layer, an aluminum-containing conductive layer may be patterned to form an aluminum-containing conductive layer pattern. The silver-containing conductive layer may expose the aluminum-containing conductive layer pattern. That is, during the etching of the silver-containing conductive layer to form the silver-containing conductive layer pattern, the aluminum-containing conductive layer pattern may be exposed to the etching solution. Here, the pad electrode 20 may be the aluminum-containing conductive layer pattern, and the pixel electrode 10 may be the silver-containing conductive layer pattern.

Figure 2A:
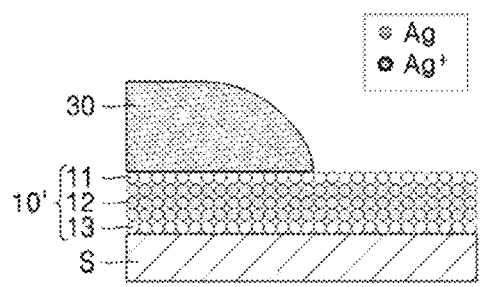
FIGS. 2a to 2f are conceptual views schematically illustrating a process of etching a silver thin film by using a thin film etchant composition according to an exemplary embodiment of the present disclosure.
Figure 2B:
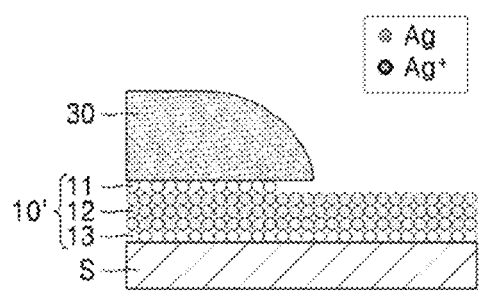

A process of patterning a silver-containing thin film 10' according to an exemplary embodiment of the present disclosure will be described with reference to FIGS. 2a to 2f. First, as shown in FIG. 2a, a photoresist (PR) layer 30 may be formed on an area where the silver-containing thin film 10' is to be patterned. The PR layer 30 may be formed by a photolithography process. In the present exemplary embodiment, a portion of the silver-containing thin film 10', on which the PR layer 30 is positioned, becomes a remaining pattern, and a portion of the silver-containing thin film 10', on which the PR layer 30 is not positioned, is removed. Also, in the present exemplary embodiment, the silver-containing thin film 10' may have a stack structure in which a third metal layer 13, a second metal layer 12, and a first metal layer 11 are sequentially stacked on the substrate S in a direction perpendicular to the surface of the substrate S. For example, the first metal layer 11, the second metal layer 12, and the third metal layer 13 may be an indium tin oxide (ITO) layer, a silver (Ag) layer, and an ITO layer, respectively. The silver-containing thin film 10' may be, for example, a pixel electrode of an organic-light emitting device (OLED). However, the present disclosure is not limited thereto. For example, the silver-containing thin film 10' may be an electrode of a liquid crystal display (LCD) device, a plasma display panel (PDP) device, or a field emission display (FED) device.

After the PR layer 30 is formed on the silver-containing thin film 10', the first metal layer 11 and the second metal layer 12 may be sequentially etched by the thin film etchant composition using the PR layer 30 as an etch mask as shown in FIGS. 2b to 2f. The thin film etchant composition according to an exemplary embodiment of the present disclosure may include nitric acid ($HNO_3$) and phosphoric acid ($H_3PO_4$). In an exemplary embodiment of the present disclosure, when the silver-containing thin film 10' has a stack structure in which an ITO layer, an Ag layer, and an ITO layer are sequentially stacked, the first metal layer 11, which is an ITO layer, may be etched through a chemical reaction represented by Reaction Formula 1 with nitric acid ($HNO_3$) and phosphoric acid ($H_3PO_4$) as etchants.

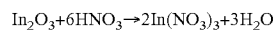

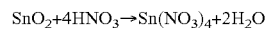

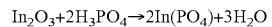

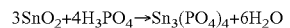        [Reaction Formula 1]

Figure 2C:
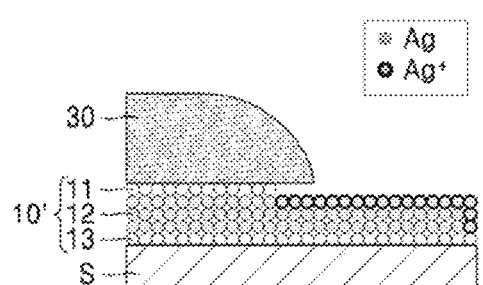
Figure 2D:
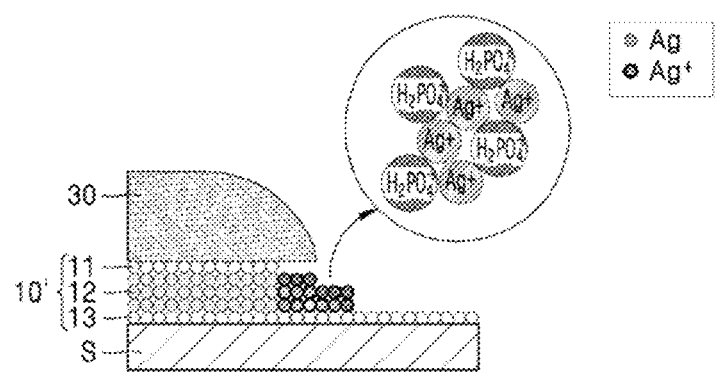
Figure 2E:
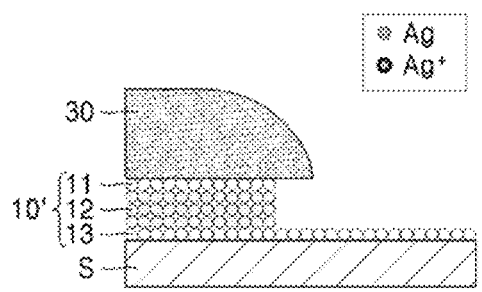

Then, as shown in FIGS. 2c to 2f, the second metal layer 12, which is an Ag layer, may be etched. First, the second metal layer 12 is oxidized to silver ions ($Ag^+$) through a chemical reaction represented by Reaction Formula 2, as shown in FIG. 2c, and then the silver ions ($Ag^+$) are etched through a chemical reaction represented by Reaction Formula 3, as shown in FIGS. 2d and 2e.

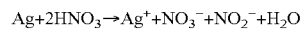        [Reaction Formula 2]

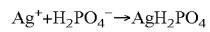        [Reaction Formula 3]

Figure 2F:
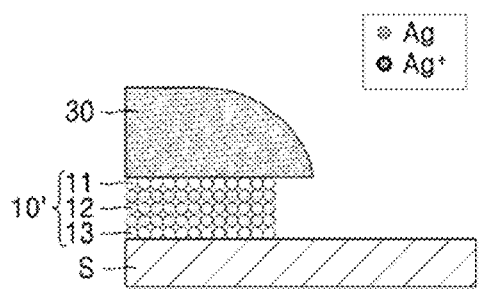

Thereafter, as shown in FIG. 2f, the third metal layer 13, which is an ITO layer, may be etched through the chemical reaction represented by Reaction Formula 1.

As shown in FIGS. 2d and 2e, the chemical reaction represented by Reaction Formula 3 illustrates that the stronger ionic interaction between silver ions ($Ag^+$) and dihydrogen phosphate ions ($H_2PO_4^-$) may help in dissolving the newly formed silver ions ($Ag^+$) in the metal layer 12 into the thin film etchant composition.

Referring back to FIG. 1, the pixel electrode 10 may be positioned on the pixel portion PX, and the pixel electrode 10 may be obtained through the patterning process described above with reference to FIGS. 2a to 2f. As shown in FIGS. 2a to 2f, the exposed portion of the first metal layer 11, which is the portion not covered by the PR layer 30, of the silver-containing thin film 10' is etched first to expose the second metal layer 12, the exposed portion of the second metal layer 12 is etched to expose the third metal layer 13, and then the exposed portion of the third metal layer 13 is etched to form the patterned silver-containing thin film 10' similar to the pixel electrode 10 shown in FIG. 1. Since, the patterning process described above with reference to FIGS. 2a to 2f is an isotropic wet etching process, the pixel electrode 10 may be slightly recessed inward under the PR layer 30 after the etching process.

In an exemplary embodiment of the present disclosure, the pixel electrode 10 may include Ag and the pad electrode 20 may include aluminum (Al). However, the present disclosure is not limited thereto. In the present exemplary embodiment, the pixel electrode 10 may have a stack structure in which the third metal layer 13, the second metal layer 12, and the first metal layer 11 are sequentially stacked on the substrate S. That is, the third metal layer 13 is the closest to the substrate S, and the first metal layer 11 is the farthest from the substrate S. The pad electrode 20 may have a stack structure in which a third metal layer 23, a second metal layer 22, and a first metal layer 21 are sequentially stacked on the substrate S. In an exemplary embodiment of the present disclosure, the first metal layer 11 and the third metal layer 13 of the pixel electrode 10 may include the same material, and the first metal layer 21 and the third metal layer 23 of the pad electrode 20 may include the same material.

The pixel electrode 10 may be a (semi)transparent electrode or a reflective electrode. When the pixel electrode 10 is a (semi)transparent electrode, the pixel electrode 10 may include, for example, ITO, indium zinc oxide (IZO), zinc oxide (ZnO), indium oxide ($In_2O_3$), indium gallium oxide (IGO), or aluminum zinc oxide (AZO). When the pixel electrode 10 is a reflective electrode, the pixel electrode 10 may include a reflective layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer including, for example, ITO, IZO, ZnO, $In_2O_3$, IGO, or AZO. However, the present disclosure is not limited thereto, and the pixel electrode 10 may include various other materials. In addition, the structure of the pixel electrode 10 may be a single-layered or multi-layered structure and may be variously changed. Specifically, the pad electrode 20 may include a single layer or multi-layer including one or more materials selected from, for example, Al, Pt, Pd, Ag, Mg, Au, Ni, Ir, Cr, lithium (Li), calcium (Ca), molybdenum (Mo), titanium (Ti), tungsten (W), and copper (Cu).

As shown in FIG. 1, the pad electrode 20 may be exposed to the outside during the etching of the pixel electrode 10. In this case, the PR layer 30 may be formed on the pixel electrode 10. That is, the pad electrode 20 may be exposed to the thin film etchant composition during the etching of the pixel electrode 10. Generally, metal ions in the pixel electrode 10 may be reduced by the pad electrode 20 exposed during the etching of the pixel electrode 10 and then re-adsorbed on the pixel electrode 10 or the pad electrode 20. In an exemplary embodiment of the present disclosure, when the pixel electrode 10 has a stack structure in which an ITO layer, an Ag layer, and an ITO layer are sequentially stacked and the pad electrode 20 has a stack structure in which a Ti layer, an Al layer, and a Ti layer are sequentially stacked, silver ions ($Ag^+$) generated during the etching of the pixel electrode 10 receive electrons generated during the etching of an Al layer and are reduced to silver (Ag), thereby forming Ag particles. In this case, particles of the reduced Ag are adsorbed on the pad electrode 20 or the pixel electrode 10. The Ag particles formed around the pad electrode 20 may be transferred into the pixel electrode 10 during a cleaning process or the like as a subsequent process, and thus, problems, such as a dark spot defect of the pixel portion PX or a connection failure of the pad portion PD, may be caused by the Ag particles.

The thin film etchant composition according to an exemplary embodiment of the present disclosure may prevent the silver ions ($Ag^+$) from being reduced and thus may prevent the re-adsorption of the Ag particles.

The thin film etchant composition according to an exemplary embodiment of the present disclosure includes about 43 wt % to about 46 wt % of phosphoric acid ($H_3PO_4$) (A), about 5 wt % to about 8 wt % of nitric acid ($HNO_3$) (B), about 10 wt % to about 17 wt % of acetic acid ($CH_3COOH$) (C), about 1 wt % to about 3 wt % of iron nitrate (D), about 0.7 wt % to about 1.5 wt % of phosphate (E), and deionized water (F) as the remaining amount based on the total weight of the thin film etchant composition.

(A) Phosphoric Acid

The phosphoric acid ($H_3PO_4$) in the thin film etchant composition according to the present exemplary embodiment is used as a main dissociation agent. For example, the phosphoric acid ($H_3PO_4$) dissociates a metal layer, which is interposed between metal oxide layers (e.g., indium oxide layer/silver (Ag) layer/indium oxide layer), oxidized by nitric acid ($HNO_3$). The metal oxide layer such as the indium oxide layer may be dissolved into the thin film etchant composition by the phosphoric acid ($H_3PO_4$) through a chemical reaction represented by Reaction Formula 1 described above. The metal layer such as silver (Ag) layer oxidized by the nitric acid ($HNO_3$) may be dissolved into the thin film etchant composition by the phosphoric acid ($H_3PO_4$) through a chemical reaction represented by Reaction Formula 3.

The thin film etchant composition according to the present exemplary embodiment may include about 43 wt % to about 46 wt % of phosphoric acid ($H_3PO_4$), based on the total weight of the thin film etchant composition. When the amount of the phosphoric acid ($H_3PO_4$) in the thin film etchant composition is less than about 43 wt %, the etching rate of silver may be lowered and silver residue may be generated. On the other hand, when the amount of the phosphoric acid ($H_3PO_4$) in the thin film etchant composition exceeds about 46 wt %, the etching rate of an indium oxide layer may be lowered, whereas the etching rate of silver may be excessively increased. Thus, when this case is applied to a multi-layer including silver or silver alloy and indium oxide, tips of upper and lower indium oxide layers may occur or an over-etching phenomenon may occur, and thus, may cause a problem in a subsequent process. In addition, when the amount of the phosphoric acid ($H_3PO_4$) in the thin film etchant composition is too high, the viscosity of the thin film etchant composition may be too high for the spraying process.

(B) Nitric Acid

The nitric acid ($HNO_3$) in the thin film etchant composition according to the present exemplary embodiment is used as a main oxidizing agent. For example, the nitric acid ($HNO_3$) oxidizes and wet-etches a silver-containing thin film such as a film including an indium oxide layer/a silver (Ag) layer/an indium oxide layer. The silver-containing thin film may be oxidized by the nitric acid ($HNO_3$) to form silver ions ($Ag^+$) through a reaction represented by the Reaction Formula 2 described above. The indium oxide layer may be dissolved into the thin film etchant composition by the nitric acid ($HNO_3$) through a chemical reaction represented by Reaction Formula 1 described above.

The thin film etchant composition according to the present exemplary embodiment may include about 5 wt % to about 8 wt % of nitric acid ($HNO_3$), based on the total weight of the thin film etchant composition. When the amount of the nitric acid ($HNO_3$) in the thin film etchant composition is less than about 5 wt %, the etching rate of silver, silver alloy, or an indium oxide layer is lowered, and thus, etching uniformity in the substrate is poor and thus a stain occurs. On the other hand, when the amount of the nitric acid ($HNO_3$) in the thin film etchant composition exceeds about 8 wt %, the etching rate of the upper and lower indium oxide layers may accelerate and an over-etching phenomenon may occur, and thus, may cause a problem in a subsequent process. In addition, when the amount of the nitric acid (HNO$_3$) in the thin film etchant composition is too high, the PR layer 30 may be damaged and may not be able to properly function as an etch mask.

(C) Acetic Acid

The acetic acid (CH$_3$COOH) in the thin film etchant composition according to the present exemplary embodiment is used as an auxiliary oxidizing agent. For example, the acetic acid (CH$_3$COOH) oxidizes and wet-etches a silver-containing thin film such as a film including an indium oxide layer/a silver (Ag) layer/an indium oxide layer. The acetic acid (CH$_3$COOH) may also enhance the wettability of the thin film etchant composition to the PR layer 30 and to the silver-containing thin film.

The thin film etchant composition according to the present exemplary embodiment may include about 10 wt % to about 17 wt % of acetic acid (CH$_3$COOH), based on the total weight of the thin film etchant composition. When the amount of the acetic acid (CH$_3$COOH) in the thin film etchant composition is less than about 10 wt %, a stain may occur due to non-uniformity of the etching rate in the substrate. When the amount of the acetic acid (CH$_3$COOH) in the thin film etchant composition exceeds about 17 wt %, bubbles may occur, and when such bubbles are present in the substrate, a complete etching may not be performed and thus may cause a problem in a subsequent process.

(D) Iron Nitrate

The iron nitrate in the thin film etchant composition according to the present exemplary embodiment prevents the occurrence of an electrical short that may be caused by a dark spot defect or unnecessary connection between wiring lines, which may occur as silver ions (Ag$^+$) or colloidal silver generated after etching are re-adsorbed at an undesired position. For example, at least one material selected from ferrous nitrate (Fe(NO$_3$)$_2$) and ferric nitrate (Fe(NO$_3$)$_3$) may be used as the iron nitrate.

(E) Phosphate

The phosphate in the thin film etchant composition according to the present exemplary embodiment reduces a threshold bias (critical dimension (CD) Bias) for a thin film during wet etching and controls an etching rate so that the etching is uniformly performed. For example, the phosphate may include at least one material selected from monosodium phosphate (NaH$_2$PO$_4$), disodium phosphate (Na$_2$HPO$_4$), trisodium phosphate (Na$_3$PO$_4$), monopotassium phosphate (KH$_2$PO$_4$), dipotassium phosphate (K$_2$HPO$_4$), monoammonium phosphate ((NH$_4$)H$_2$PO$_4$), diammonium phosphate ((NH$_4$)$_2$HPO$_4$), and triammonium phosphate ((NH$_4$)$_3$PO$_4$). Since most compounds containing hydrogen phosphate ions (HPO$_4^{2-}$) and dihydrogen phosphate ions (H$_2$PO$_4^-$) are soluble in water, these types of ions may be more suitable than the phosphate ions (PO$_4^{3-}$) for the present exemplary embodiment. However, the present disclosure is not limited thereto.

(F) Deionized Water

The deionized water in the thin film etchant composition according to the present exemplary embodiment is not particularly limited and may be deionized water having a resistivity value of 18 MΩ·cm or more for semiconductor processing. The deionized water may be included in the thin film etchant composition as the remaining amount based on the total weight of the thin film etchant composition.

The thin film etchant composition according to an exemplary embodiment of the present disclosure may further include one or more selected from, for example, an etching control agent, a surfactant, a sequestering agent, a corrosion inhibitor, a pH adjusting agent, and another additive, in addition to the above-mentioned components. The additive may be selected from additives commonly used in the art in order to further enhance the effects of the present disclosure within the scope of the present disclosure. In addition, the components constituting the thin film etchant composition according to an exemplary embodiment of the present disclosure may have purity for semiconductor processing.

The thin film etchant composition according to an exemplary embodiment of the present disclosure may etch a single layer including silver or silver alloy, or a multi-layer including the single layer and an indium oxide layer. In the present exemplary embodiment, the indium oxide layer may include one or more materials selected from, for example, indium tin oxide (ITO), indium zinc oxide (IZO), indium tin zinc oxide (ITZO), and indium gallium zinc oxide (IGZO). The silver alloy may include Ag and one or more selected from, for example, neodymium (Nd), copper (Cu), palladium (Pd), niobium (Nb), nickel (Ni), molybdenum (Mo), chromium (Cr), magnesium (Mg), tungsten (WV), protactinium (Pa), and titanium (Ti).

Figure 3:
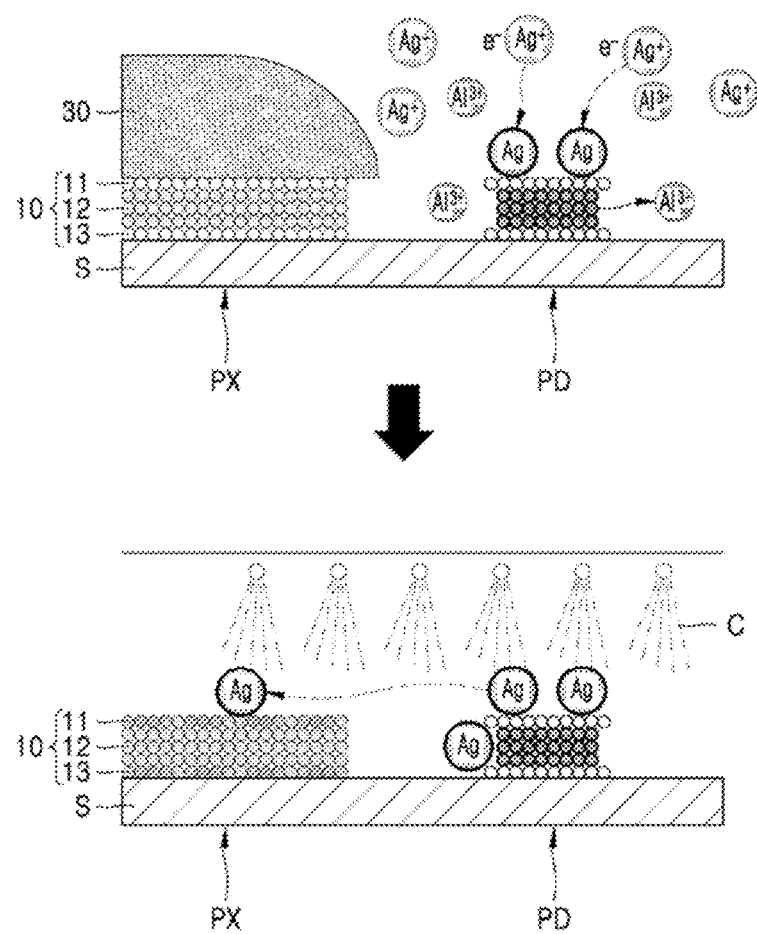
FIGS. 3 and 4 are conceptual views schematically illustrating a process of etching a silver thin film by using a thin film etchant composition according to the related art.

Referring to FIG. 3, the pad electrode 20 is exposed to the outside, for example, exposed to the thin film etchant composition, while the pixel electrode 10 is etched and patterned on the substrate S, as described above. For example, when the pixel electrode 10 includes silver (Ag) and the pad electrode 20 includes aluminum (Al), chemical reactions represented by the following reaction formulas occur during the etch process.

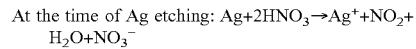

At the time of Ag etching: Ag+2HNO$_3$→Ag$^+$+NO$_2$+ H$_2$O+NO$_3^-$

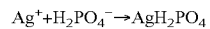

Ag$^+$+H$_2$PO$_4^-$→AgH$_2$PO$_4$

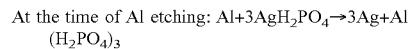

At the time of Al etching: Al+3AgH$_2$PO$_4$→3Ag+Al (H$_2$PO$_4$)$_3$

As illustrated in FIG. 3 and the reaction formulas above, the pixel electrode 10 including silver (Ag) is etched by an etchant, for example, nitric acid (HNO$_3$), to thereby generate silver ions (Ag$^+$), and the silver ions (Ag$^+$) are reduced by aluminum (Al) in the pad electrode 20 exposed to the outside, for example, exposed to the thin film etchant composition, while the pixel electrode 10 is etched, to thereby precipitate silver (Ag) particles. At the same time, a portion of the aluminum (Al) in the pad electrodes 20 may be oxidized by the silver ions (Ag$^+$) to form aluminum ions (Al$^{3+}$) and dissolved in the thin film etchant composition. The precipitated silver (Ag) particles are adsorbed on the side and top of the pad electrode 20, and then the adsorbed silver (Ag) particles are separated from the pad electrode 20 by a cleaning liquid C injected during a cleaning process or the like as a subsequent process and are transferred to the pixel electrode 10. The silver (Ag) particles adsorbed on the pad electrode 20 and the silver (Ag) particles transferred to the pixel electrode 10 may cause problems such as a dark spot defect in the pixel portion PX and/or a connection failure in the pad portion PD.

The thin film etchant composition according to an exemplary embodiment of the present disclosure may prevent iron nitrate from being coordinated with silver ions (Ag$^+$) to be reduced to silver (Ag) particles. In the present embodiment, ferric nitrate (Fe(NO$_3$)$_3$) may be used as the iron nitrate. Ferric nitrate (Fe(NO$_3$)$_3$) is a strong oxidizer. For example, similar to nitric acid (HNO$_3$), ferric nitrate (Fe(NO$_3$)$_3$) may be used to etch silver (Ag) by oxidizing silver (Ag) to silver ions (Ag$^+$), and thus, may prevent the reduction of the silver ions (Ag$^+$) to silver (Ag) particles. However, the present disclosure is not limited thereto. In addition, in the thin film etchant composition according to an exemplary embodiment of the present disclosure, the content of phosphoric acid ($H_3PO_4$) relative to the weight of iron nitrate may be reduced to thereby reduce damage to the pad electrode 20.

Figure 4:
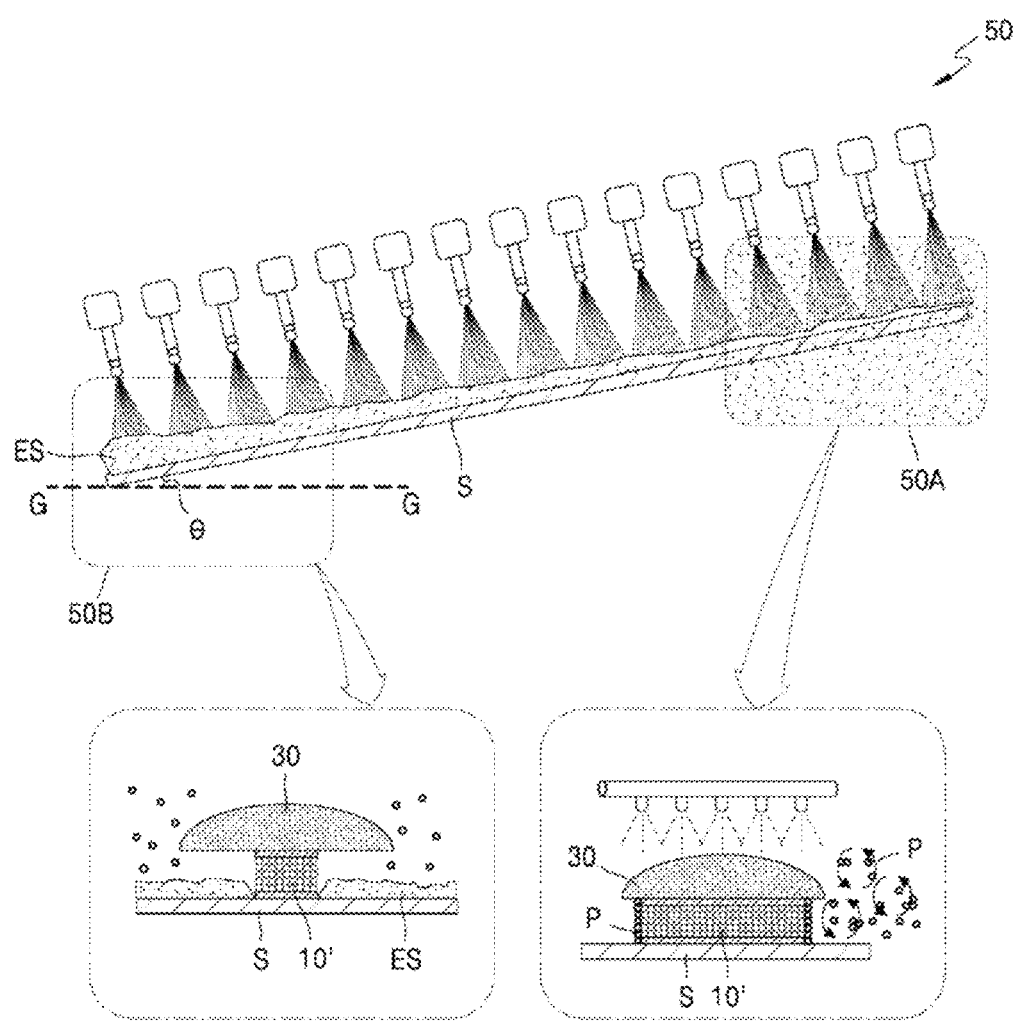

Referring to FIG. 4, an etching apparatus 50 using a thin film etchant composition according to the related art generally has an inclination (8) of about 5° from the ground G, and thus, when an etching process is performed, a lower liquid film is thickened as an etchant ES flows down, and thus, a dipping phenomenon of a thin film occurs on a substrate S positioned in a lower end portion 50B of the etching apparatus 50. As a result, in an upper end portion 50A of the etching apparatus 50, an etching rate decreases due to the agglomeration of silver particles P on the side of a silver-containing thin film 10'. On the other hand, the thin film on the substrate S positioned in the lower end portion 50B of the etching apparatus 50 may be over-etched due to an increase in etching amount caused by acceleration of etching occurring due to the dipping phenomenon. For example, the silver-containing thin film 10' may be excessively recessed inward under the PR layer 30 in the lower end portion 50B of the etching apparatus 50. In other words, the thin film on the substrate S positioned in the lower end portion 50B of the etching apparatus 50 may be over-etched to obtain a smaller CD. This unevenness of the etchant ES causes a CD deviation between an upper portion and a lower portion of the thin film.

To address the above issue, in an exemplary embodiment of the present disclosure, a thin film etchant composition, in which the content of phosphoric acid ($H_3PO_4$) having the highest viscosity is reduced, is provided to smooth the flow of an etchant. That is, phosphoric acid ($H_3PO_4$) is a main dissociation agent of silver (Ag), and when the content of phosphoric acid ($H_3PO_4$) is reduced in an etchant, a silver (Ag) thin film may not be etched and a function of the etchant weakens. Therefore, it is necessary to secure a new component capable of replacing phosphoric acid ($H_3PO_4$) to reduce phosphoric acid ($H_3PO_4$) content in the etchant. In the thin film etchant composition according to the present embodiment, iron nitrate is used as a substitute dissociating agent for phosphoric acid ($H_3PO_4$) to reduce the content of the phosphoric acid ($H_3PO_4$). The thin film etchant composition according to the present exemplary embodiment, in which the content of phosphoric acid ($H_3PO_4$) is reduced, may lower the viscosity of an etchant itself as the content of the phosphoric acid ($H_3PO_4$) having a high viscosity is reduced. That is, the thin film etchant composition according to the present exemplary embodiment may have a viscosity (in units of centipoise, cP) in a range of about 5.0 to about 5.5 at 40° C. Thus, the flow of the etchant is smoothed, thereby reducing a thin film dipping phenomenon of the substrate S positioned at the lower end portion 50B of the etching apparatus 50.

Figure 5:
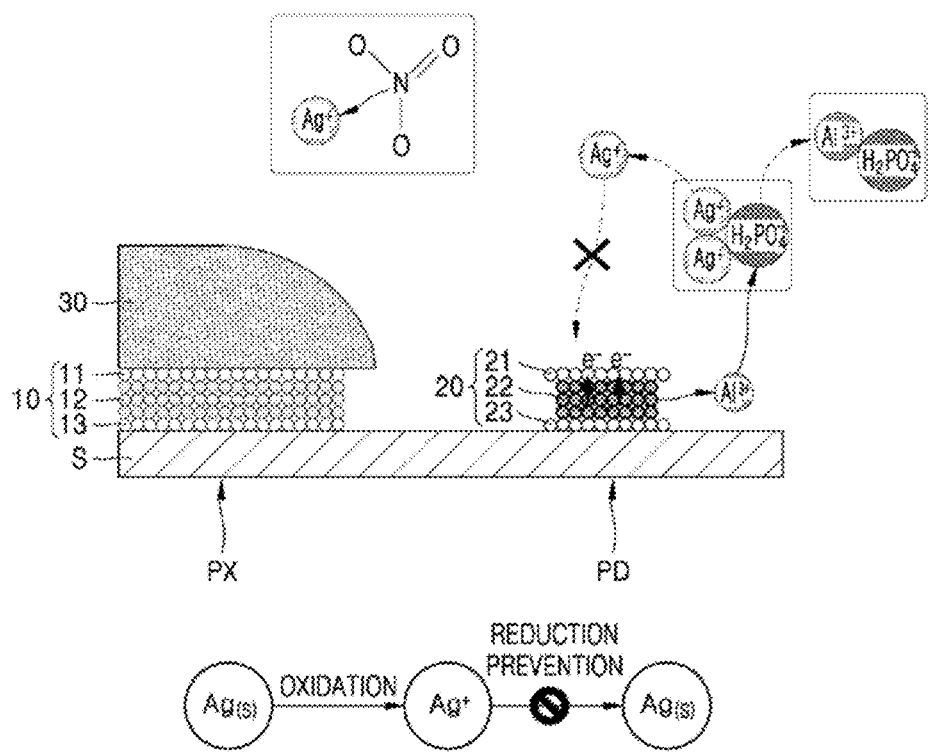
FIG. 5 is a conceptual view illustrating a process of etching a thin film by using a thin film etchant composition according to an exemplary embodiment of the present disclosure.

FIG. 5 is a conceptual view illustrating a process of etching a thin film by using a thin film etchant composition according to an exemplary embodiment of the present disclosure. As illustrated in FIG. 5, when the aluminum (Al) included in the pad electrode 20 forms the aluminum ions ($Al^{3+}$) and releases electrons ($e^-$), the thin film etchant composition according to an exemplary embodiment of the present disclosure may prevent the silver ions ($Ag^+$) from combining the released electrons ($e^-$) by the aluminum (Al) to form the silver (Ag) particles. For example, the thin film etchant composition of the present exemplary embodiment may prevent the reduction of the silver ions ($Ag^+$) to silver (Ag) particles.

Although the thin film etchant composition has been mainly described above, the present disclosure is not limited thereto. For example, a method of forming a conductive layer pattern by using the thin film etchant composition and a method of manufacturing an array substrate for a display device by using the thin film etchant composition are also within the scope of the present disclosure.

A method of forming a conductive layer pattern, according to an exemplary embodiment of the present disclosure, includes covering a conductive layer including silver (Ag) on a substrate and etching the conductive layer to form the conductive layer pattern. In this case, the thin film etchant compositions according to the above-described embodiments may be used in the etching of the conductive layer to form the conductive layer pattern.

A method of manufacturing an array substrate for a display device, according to an exemplary embodiment of the present disclosure, includes (a) forming a semiconductor layer on a substrate, (b) forming a gate electrode on the semiconductor layer, (c) forming a source electrode and a drain electrode over the gate electrode, (d) forming a thin film electrically connected to the source electrode or the drain electrode and including silver (Ag), and (e) etching the thin film to form a pixel electrode. The sequence of the steps (a) to (e) as described above is preferred. However, the present disclosure is not limited to the performance of these steps with the sequence or order presented above. Many steps may also be applied to the substrate before, between or after the steps shown above. In the etching of the thin film to form a pixel electrode, the pixel electrode may be formed by etching the thin film with the thin film etchant compositions according to the above-described exemplary embodiments.

Figure 6:
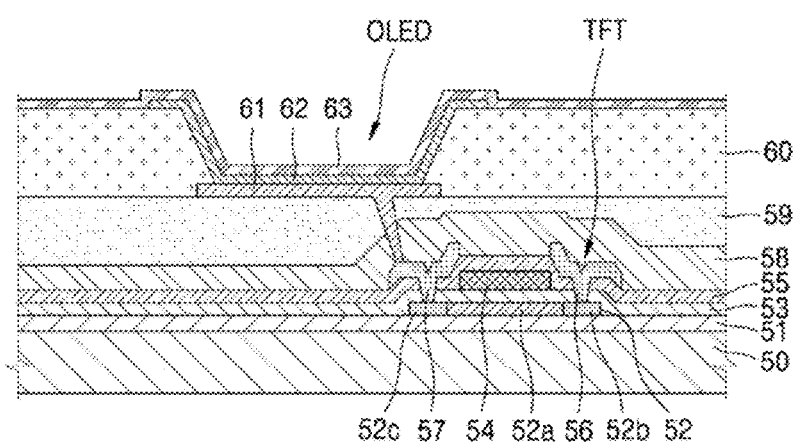
FIG. 6 is a cross-sectional view illustrating a portion of an array substrate for a display device according to an exemplary embodiment of the present disclosure.

FIG. 6 is a cross-sectional view illustrating a portion of an array substrate for a display device according to an exemplary embodiment of the present disclosure.

Referring to FIG. 6, various components of the array substrate for a display device are formed on a substrate 50. The substrate 50 may include a transparent material such as, for example, a glass material, a plastic material, or a metal material.

Common layers such as a buffer layer 51, a gate insulating layer 53, an interlayer insulating layer 55, and a protective layer 58 may be formed over the entire surface of the substrate 50. A patterned semiconductor layer 52 including a channel region 52a, a source contact region 52b, and a drain contact region 52c may be formed on the buffer layer 51, and a gate electrode 54, a source electrode 56, and a drain electrode 57, which are components of a thin film transistor, may be formed over the patterned semiconductor layer 52.

A planarization layer 59 covering the thin film transistor and having a flat upper surface may be formed over the entire surface of the substrate 50. An organic light-emitting device (OLED), which includes a pixel electrode 61, an opposite electrode 63 substantially corresponding to the entire surface of the substrate 50, and an intermediate layer 62 having a multi-layered structure, may be positioned on the planarization layer 59. The intermediate layer 62 is disposed between the pixel electrode 61 and the opposite electrode 63 and includes an emission layer. Unlike in FIG. 5, some layers in the intermediate layer 62 may be common layers substantially corresponding to the entire surface of the substrate 50 and some other layers in the intermediate layer 62 may be patterned layers corresponding to the pixel electrode 61. In FIG. 5, the pixel electrode 10 and the pad electrode 20 are both patterned layers. The pixel electrode 61 may be electrically connected to the thin film transistor through a via hole. A pixel-defining layer 60 covering the edge of the pixel electrode 61 and having an opening defining each pixel region may be formed on the planarization layer 59 to substantially correspond to the entire surface of the substrate 50.

In an exemplary embodiment of the present disclosure, the patterned semiconductor layer 52 may be an oxide semiconductor layer or a polysilicon layer, and at least one of the gate electrode 54 and the source and drain electrodes 56 and 57 may include aluminum (Al).

In an exemplary embodiment of the present disclosure, the method including steps (a) to (e) may further include (f) forming a pad portion on one side of the substrate 50, and a pad electrode in the pad portion may include aluminum (Al). The forming of the pad portion may be performed simultaneously with the forming of the gate electrode 54 or the forming of the source electrode 56 and the drain electrode 57.

In the present exemplary embodiment, during the forming of the pad portion, the pad electrode may be exposed to the outside. Also, the pad electrode may be exposed to the outside during the etching of the pixel electrode 61. For example, during the etching of a thin film to form the pixel electrode 61, the pad electrode may be exposed to the thin film etchant compositions according to the above-described exemplary embodiments.

FIGS. 7a and 7b are scanning electron microscope (SEM) photographs taken to check whether a silver (Ag) residue occurs after an electrode layer is etched with an etchant, and that silver (Ag) residue occurs in the electrode layer etched with an etchant according to the related art and is adsorbed to the electrode layer. Silver (Ag) particles of the adsorbed silver (Ag) residue may cause defects such as a dark spot in a pixel. On the other hand, it may be seen that silver (Ag) residue does not occur in the electrode layer etched with the thin film etchant composition according to the present exemplary embodiment. The thin film etchant composition according to the present exemplary embodiment may prevent silver ions ($Ag^+$) from being reduced, for example, by including iron nitrate, and thus prevent silver (Ag) from being precipitated.

FIG. 8a is an SEM photograph of an electrode layer etched with an etchant according to the related art, and FIG. 8b is an SEM photograph of an electrode layer etched with the thin film etchant composition according to an exemplary embodiment of the present disclosure. In FIGS. 8a and 8b, an electrode layer having a stack structure of an ITO layer/an Ag layer/an ITO layer is taken as an example. As shown in FIG. 8a, it may be seen that a tip defect occurs in an upper ITO layer in the electrode layer etched with an etchant according to the related art, whereas a tip defect does not occur in an upper ITO layer in the electrode layer etched with the thin film etchant composition according to the present exemplary embodiment as shown in FIG. 8b.

Table 1 shows evaluation results of the thin film etchant composition according to an exemplary embodiment of the present disclosure, and Table 2 shows evaluation results of a thin film etchant composition according to a comparative example.

TABLE 1

| | | PHOSPHORIC ACID | NITRIC ACID | ACETIC ACID | FERRIC NITRATE ($Fe(NO_3)_3$) | MONOSODIUM PHOSPHATE ($NaH_2PO_4$) | Ag ETCHING AMOUNT | Ag RE-ADSORPTION | UPPER ITO TIP |
|---|---|---|---|---|---|---|---|---|---|
| EMBODIMENT | 1 | 45 | 6.5 | 15 | 2 | 1 | ◎ | ◎ | ◎ |
| | 2 | 43 | 6.5 | 15 | 2 | 1 | ○ | ○ | ◎ |
| | 3 | 45 | 8 | 15 | 2 | 1 | ○ | ○ | ◎ |
| | 4 | 45 | 8 | 15 | 2 | 1 | ○ | ◎ | ◎ |
| | 5 | 45 | 6.5 | 10 | 2 | 1 | ○ | ◎ | ◎ |
| | 6 | 45 | 6.5 | 17 | 2 | 1 | ○ | ○ | ◎ |
| | 7 | 45 | 6.5 | 10 | 1 | 1 | ○ | ○ | ◎ |
| | 8 | 45 | 6.5 | 10 | 3 | 1 | ○ | ○ | ◎ |
| | 9 | 45 | 6.5 | 15 | 2 | 0.7 | ○ | ○ | ◎ |

[EVALUATION CRITERION OF AG ETCHING AMOUNT]
◎: very excellent (Side Etch: <0.1 μm)
○: excellent(Side Etch: <0.2 μm, >0.1 μm)
Δ: good (Side Etch: <0.3 μm, >0.2 μm)
X: bad (Side Etch: >0.3 μm)
[EVALUATION CRITERION OF AG RE-ADSORPTION]
◎: very excellent (50 or less)
○: excellent(80 or less)
Δ: good (100 or less)
X: bad (100 or more)
[EVALUATION CRITERION OF UPPER ITO TIP]
◎: NO TIP GENERATION_GOOD
X: TIP GENERATION_BAD FIGS. 8a and 8b are SEM photographs taken to check whether a tip defect occurs in an upper ITO layer after an electrode layer is etched with an etchant.

FIG. 7a is an SEM photograph of an electrode layer etched with an etchant according to the related art, and FIG. 7b is an SEM photograph of an electrode layer etched with the thin film etchant composition according to an exemplary embodiment of the present disclosure. The electrode layer includes silver (Ag). As shown in FIG. 7a, it may be seen Table 1 shows thin film etchant compositions according to embodiments 1 to 9. Each of the thin film etchant compositions according to embodiments 1 to 9 includes about 43 wt % to about 46 wt % of phosphoric acid ($H_3PO_4$), about 5 wt % to about 8 wt % of nitric acid ($HNO_3$), about 10 wt % to about 17 wt % of acetic acid ($CH_3COOH$), about 1 wt % to about 3 wt % of iron nitrate, about 0.7 wt % to about 1.5 wt % of phosphate, and deionized water as the remaining amount based on the total weight of the thin film etchant composition. In this case, ferric nitrate (Fe(NO$_3$)$_3$) is used as the iron nitrate and monosodium phosphate (NaH$_2$PO$_4$) is used as the phosphate.

Referring to Table 1, evaluation results for a silver (Ag) etching amount, a silver (Ag) re-adsorption, an upper ITO tip are generally excellent. Particularly, the thin film etchant composition (embodiment 1), which includes about 45 wt % of phosphoric acid (H$_3$PO$_4$), about 6.5 wt % of nitric acid (HNO$_3$), about 15 wt % of acetic acid (CH$_3$COOH), about 2 wt % of ferric nitrate (Fe(NO$_3$)$_3$), and about 1 wt % of monosodium phosphate (NaH$_2$PO$_4$), based on the total weight of the thin film etchant composition, shows excellent evaluation results with respect to the silver (Ag) etching amount, the silver (Ag) re-absorption, and the upper ITO tip.

phoric acid (H$_3$PO$_4$) to reduce the content of the phosphoric acid (H$_3$PO$_4$). The thin film etchant composition according to the present exemplary embodiment, in which the content of phosphoric acid (H$_3$PO$_4$) is reduced, may lower the viscosity of an etchant itself as the content of the phosphoric acid (H$_3$PO$_4$) having a high viscosity is reduced. That is, the thin film etchant composition according to the present exemplary embodiment may have a viscosity (in units of centipoise, cP) in a range of about 5.0 to about 5.5 at 40° C. Thus, the flow of the etchant is smoothed, thereby reducing a thin film dipping phenomenon of the substrate S positioned at the lower end portion 50B of the etching apparatus 50.

According to the exemplary embodiments of the present disclosure described above, a thin film etchant composition

TABLE 2

| | | PHOSPHORIC ACID | NITRIC ACID | ACETIC ACID | FERRIC NITRATE (Fe(NO$_3$)$_3$) | MONOSODIUM PHOSPHATE (NaH$_2$PO$_4$) | Ag ETCHING AMOUNT | Ag RE-ADSORPTION | UPPER ITO TIP |
|---|---|---|---|---|---|---|---|---|---|
| COMPARATIVE EXAMPLE | 1 | 42 | 6.5 | 15 | 2 | 1 | Δ | X | ⊙ |
| | 2 | 46 | 6.5 | 15 | 2 | 1 | X | Δ | ⊙ |
| | 3 | 45 | 4 | 15 | 2 | 1 | Δ | X | ⊙ |
| | 4 | 45 | 9 | 15 | 2 | 1 | X | Δ | ⊙ |
| | 5 | 45 | 6.5 | 9 | 2 | 1 | Δ | X | ⊙ |
| | 6 | 45 | 6.5 | 18 | 2 | 1 | X | Δ | ⊙ |
| | 7 | 45 | 6.5 | 10 | 0.9 | 1 | Δ | X | ⊙ |
| | 8 | 45 | 6.5 | 10 | 3.5 | 1 | X | X | ⊙ |
| | 9 | 45 | 6.5 | 15 | 2 | 0.7 | Δ | X | X |
| | 10 | 45 | 6.5 | 15 | 2 | 1.5 | X | Δ | X |

[EVALUATION CRITERION OF AG ETCHING AMOUNT]
⊙: very excellent (Side Etch: <0.1 μm)
○: excellent (Side Etch: <0.2 μm, >0.1 μm)
Δ: good (Side Etch: <0.3 μm, >0.2 μm)
X: bad (Side Etch: >0.3 μm)
[EVALUATION CRITERION OF AG RE-ADSORPTION]
⊙: very excellent (50 or less)
○: excellent (80 or less)
Δ: good (100 or less)
X: bad (100 or more)
[EVALUATION CRITERION OF UPPER ITO TIP]
⊙: NO TIP GENERATION_GOOD
X: TIP GENERATION_BAD On the other hand, Table 2 shows thin film etchant compositions according to comparative examples 1 to 10. The composition of each of comparative examples 1 to 10 is prepared to deviate from a composition range of the thin film etchant composition according to the exemplary embodiment of the present disclosure described above with respect to at least one of phosphoric acid (H$_3$PO$_4$), nitric acid (HNO$_3$), acetic acid (CH$_3$COOH), iron nitrate, and phosphate. Referring to Table 2, each of evaluation results with respect to a silver (Ag) etching amount, a silver (Ag) re-adsorption, an upper ITO tip is good or bad.

The thin film etchant composition according to an exemplary embodiment of the present disclosure may prevent iron nitrate from being coordinated with silver ions (Ag$^+$) to be reduced to silver (Ag) particles. In the present exemplary embodiment, ferric nitrate (Fe(NO$_3$)$_3$) may be used as the iron nitrate. However, the present disclosure is not limited thereto. In addition, in the thin film etchant composition according to an exemplary embodiment of the present disclosure, the content of phosphoric acid (H$_3$PO$_4$) relative to the weight of iron nitrate may be reduced to thereby reduce damage to the pad electrode 20.

In the thin film etchant composition according to an exemplary embodiment of the present disclosure, iron nitrate is used as a substitute dissociating agent for phoscapable of preventing re-adsorption of an etched metal and uniformly etching a thin film may be realized.

It should be understood that the exemplary embodiments of the present disclosure described herein should be considered in a descriptive sense only and not for purposes of limitation. Descriptions of features or aspects within each exemplary embodiment should typically be considered as available for other similar features or aspects in other embodiments.

While the exemplary embodiments have been described with reference to the figures, it will be understood by those of ordinary skill in the art that various changes in form and details may be made therein without departing from the spirit and scope of the present disclosure as defined by the following claims.

What is claimed is:

1. A method for etching a silver-containing conductive layer, the method comprising:
    providing a silver-containing conductive layer and a pad electrode, the pad electrode comprising aluminum; and
    etching the silver-containing conductive layer with a thin film etchant composition, while the pad electrode is exposed to the thin film etchant composition, to form a silver-containing conductive layer pattern, the thin film etchant composition comprising:

about 43 wt % to about 46 wt % of phosphoric acid;
about 5 wt % to about 8 wt % of nitric acid;
about 10 wt % to about 17 wt % of acetic acid;
about 1 wt % to about 3 wt % of iron nitrate;
about 0.7 wt % to about 1.5 wt % of phosphate; and
deionized water as a remaining amount based on a total weight of the thin film etchant composition,
wherein the iron nitrate comprises ferric nitrate which is used to etch silver (Ag) by oxidizing silver (Ag) to silver ions ($Ag^+$), and prevents reduction of the silver ions ($Ag^+$) to silver (Ag) particles, and
wherein the thin film etchant composition has a viscosity in a range of about 5.0 cP to about 5.5 cP at 40° C.

2. The method of claim 1, wherein the thin film etchant composition is capable of etching a single layer comprising silver (Ag) or silver alloy, or a multi-layer comprising the single layer and an indium-containing oxide layer.

3. The method of claim 2, wherein the indium-containing oxide layer comprises one or more selected from indium tin oxide (ITO), indium zinc oxide (IZO), indium tin zinc oxide (ITZO), and indium gallium zinc oxide (IGZO).

4. The method of claim 2, wherein the silver alloy comprises silver (Ag) and one or more selected from neodymium (Nd), copper (Cu), palladium (Pd), niobium (Nb), nickel (Ni), molybdenum (Mo), chromium (Cr), magnesium (Mg), tungsten (W), protactinium (Pa), and titanium (Ti).

5. The method of claim 1, wherein the phosphate comprises one or more selected from monosodium phosphate ($NaH_2PO_4$), disodium phosphate ($Na_2HPO_4$), trisodium phosphate ($Na_3PO_4$), monopotassium phosphate ($KH_2PO_4$), dipotassium phosphate ($K_2HPO_4$), monoammonium phosphate (($NH_4)H_2PO_4$), diammonium phosphate (($NH_4)_2HPO_4$), and triammonium phosphate (($NH_4)_3PO_4$).

6. The method of claim 1, wherein the thin film etchant composition comprises 45 wt % of phosphoric acid, 6.5 wt % of nitric acid, 15 wt % of acetic acid, 2 wt % of iron nitrate, 1 wt % of phosphate, and deionized water as a remaining amount based on the total weight of the thin film etchant composition.

7. A method of forming a conductive layer pattern, the method comprising:
preparing a substrate on which a conductive layer comprising silver (Ag) is positioned; and
etching the conductive layer to form the conductive layer pattern,
wherein the etching of the conductive layer comprises etching the conductive layer with a thin film etchant composition comprising about 43 wt % to about 46 wt % of phosphoric acid, about 5 wt % to about 8 wt % of nitric acid, about 10 wt % to about 17 wt % of acetic acid, about 1 wt % to about 3 wt % of iron nitrate, about 0.7 wt % to about 1.5 wt % of phosphate, and deionized water as a remaining amount based on a total weight of the thin film etchant composition.

8. A method of manufacturing an array substrate for a display device, the method comprising:
forming a semiconductor layer on a substrate;
forming a gate electrode over the semiconductor layer;
forming a source electrode and a drain electrode over the gate electrode;
forming a thin film electrically connected to the source electrode or the drain electrode, the thin film comprising silver (Ag); and
etching the thin film to form a pixel electrode,
wherein the etching of the thin film comprises etching the thin film with a thin film etchant composition comprising about 43 wt % to about 46 wt % of phosphoric acid, about 5 wt % to about 8 wt % of nitric acid, about 10 wt % to about 17 wt % of acetic acid, about 1 wt % to about 3 wt % of iron nitrate, about 0.7 wt % to about 1.5 wt % of phosphate, and deionized water as a remaining amount based on a total weight of the thin film etchant composition.

9. The method of claim 8, wherein at least one of the gate electrode, the source electrode and the drain electrode comprises aluminum (Al).

10. The method of claim 9, further comprising:
forming a pad portion on one side of the substrate, wherein a pad electrode in the pad portion comprises aluminum (Al).

11. The method of claim 10, wherein the forming of the pad portion is performed simultaneously with the forming of the gate electrode or the forming of the source electrode and the drain electrode.

12. The method of claim 10, wherein, during the etching of the thin film, the pad electrode is exposed to the thin film etchant composition.

13. A method of etching a thin film, the method comprising: etching a thin film with and exposing a pad electrode to a thin film etchant composition, the thin film comprising silver (Ag), and the thin film etchant composition comprising phosphoric acid, nitric acid, acetic acid, ferric nitrate ($Fe(NO_3)_3$), and monosodium phosphate ($NaH_2PO_4$),
wherein the thin film etchant composition has a viscosity in a range of about 5.0 cP to about 5.5 cP at 40° C., and
wherein ferric nitrate is used to etch silver (Ag) by oxidizing silver (Ag) to silver ions ($Ag^+$), and prevents reduction of the silver ions ($Ag^+$) to silver (Ag) particles.

14. The method of claim 13, wherein the thin film etchant composition comprises:
about 43 wt % to about 46 wt % of the phosphoric acid;
about 5 wt % to about 8 wt % of the nitric acid;
about 10 wt % to about 17 wt % of the acetic acid;
about 1 wt % to about 3 wt % of the ferric nitrate ($Fe(NO_3)_3$);
about 0.7 wt % to about 1.5 wt % of the monosodium phosphate ($NaH_2PO_4$); and
deionized water as a remaining amount based on a total weight of the thin film etchant composition.

15. The method of claim 13, wherein the thin film etchant composition is capable of etching a single layer comprising silver (Ag) or silver alloy, or a multi-layer comprising the single layer and an indium-containing oxide layer.

16. The method of claim 15, wherein the indium-containing oxide layer comprises one or more selected from indium tin oxide (ITO), indium zinc oxide (IZO), indium tin zinc oxide (ITZO), and indium gallium zinc oxide (IGZO).

17. The method of claim 15, wherein the silver alloy comprises silver (Ag) and one or more selected from neodymium (Nd), copper (Cu), palladium (Pd), niobium (Nb), nickel (Ni), molybdenum (Mo), chromium (Cr), magnesium (Mg), tungsten (W), protactinium (Pa), and titanium (Ti).

18. A method of forming a silver-containing conductive layer pattern, the method comprising:
preparing a substrate;
forming an aluminum-containing conductive layer pattern on the substrate;
forming a silver-containing conductive layer on the substrate and exposing the aluminum-containing conductive layer pattern; and
etching the silver-containing conductive layer to form the silver-containing conductive layer pattern with a thin film etchant composition, wherein the thin film etchant composition comprises about 43 wt % to about 46 wt % of phosphoric acid, about 5 wt % to about 8 wt % of nitric acid, about 10 wt % to about 17 wt % of acetic acid, about 1 wt % to about 3 wt % of ferric nitrate ($Fe(NO_3)_3$), about 0.7 wt % to about 1.5 wt % of phosphate, and deionized water as a remaining amount based on a total weight of the thin film etchant composition.

19. The method of claim 18, wherein during the etching of the silver-containing conductive layer, the aluminum-containing conductive layer pattern is exposed to the thin film etchant composition.

* * * * *